United States Patent
Lin et al.

(10) Patent No.: US 8,723,256 B1
(45) Date of Patent: *May 13, 2014

(54) SEMICONDUCTOR DEVICE AND FABRICATING METHOD THEREOF

(71) Applicant: Vanguard International Semiconductor Corporation, Hsinchu (TW)

(72) Inventors: Wen-Cheng Lin, Taipei (TW); Shang-Hui Tu, Jhubei (TW); Shin-Cheng Lin, Tainan (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/670,951

(22) Filed: Nov. 7, 2012

(51) Int. Cl.
*H01L 29/66* (2006.01)

(52) U.S. Cl.
USPC ............ 257/335; 257/339; 257/341; 257/371

(58) Field of Classification Search
USPC ............ 257/23, 343, E27.065, E27.066, 335, 257/339, 341, 371
See application file for complete search history.

(56) References Cited

U.S. PATENT DOCUMENTS

2011/0168872 A1* 7/2011 Kobayashi et al. ........ 250/208.1

* cited by examiner

*Primary Examiner* — Tan N Tran
(74) *Attorney, Agent, or Firm* — Birch, Stewart, Kolasch & Birch, LLP

(57) ABSTRACT

A semiconductor device is provided. The device includes a semiconductor substrate and a gate structure thereon. A well region is formed in the semiconductor substrate. A drain region and a source region are respectively formed in the semiconductor substrate inside and outside of the well region. At least one set of the first and second heavily doped regions is formed in the well region between the drain region and the source region, wherein the first and second heavily doped regions are stacked vertically from bottom to top and have a doping concentration which is larger than that of the well region. The semiconductor substrate and the first heavily doped region have a first conductivity type and the well region and the second heavily doped region have a second conductivity type. A method for fabricating a semiconductor device is also disclosed.

12 Claims, 3 Drawing Sheets

SEMICONDUCTOR DEVICE AND FABRICATING METHOD THEREOF

BACKGROUND OF THE INVENTION

1. Field of the Invention

The present invention relates to a semiconductor device, and in particular, to a semiconductor device having a super junction structure and a method for manufacturing the same.

2. Description of the Related Art

Semiconductor devices, such as high voltage elements, are typically divided into: vertical double-diffused metal-oxide-semiconductor field effect transistors (VDMOSFETs) and laterally diffused metal-oxide-semiconductor field effect transistors (LDMOSFETs). In order to increase the withstand voltage of the described high voltage elements, the doping concentration of the deep well region (or referred to as the drift region) is reduced, the depth of the drift region is increased, or the length of the isolation structure (or referred to as the field oxide layer) underlying the gate is increased.

FIG. 1 is a cross section of a conventional n-type LDMOSFET. The n-type LDMOSFET 10 comprises a p-type semiconductor substrate 100 and a p-type epitaxial layer 102 thereon. A gate structure 116 and a field oxide layer 114 are on the p-type epitaxial layer 102. Moreover, a p-type body region 106 and an n-type drift region 104 are respectively in the p-type epitaxial layer 102 on both sides of the gate structure 116, wherein the n-type drift region 104 further extends into the underlying p-type semiconductor substrate 100. A p-type contact region 108 and an adjacent n-type contact region 110 (or both referred to as a source region) are in the body region 106 and an n-type contact region 112 (or referred to as a drain region) is in the drift region 104. Moreover, a source electrode 117 is electrically connected to the p-type contact region 108 and the n-type contact region 110. A drain electrode 119 is electrically connected to the n-type contact region 112. A gate electrode 121 is electrically connected to the gate structure 116.

As mentioned above, in order to improve the withstand voltage of the transistor 10, the doping concentration of the drift region 104 has to be reduced and/or the length of the field oxide layer 114 underlying the gate structure 116 has to be increased. However, when the withstand voltage is increased by the described ways, the on-resistance (Ron) or the size of the transistor 10 is also increased.

Thus, there exists a need in the art for development of a semiconductor device, capable of increasing the withstand voltage while preventing the on-resistance from increasing.

BRIEF SUMMARY OF INVENTION

A detailed description is given in the following embodiments with reference to the accompanying drawings. Semiconductor devices and methods for fabricating the same are provided.

An exemplary embodiment of a semiconductor device includes a semiconductor substrate of a first conductivity type. A well region of a second conductivity type is formed in the semiconductor substrate. A drain region and a source region are respectively formed in the semiconductor substrate inside and outside of the well region. At least one set of the first and second heavily doped regions is formed in the well region between the drain region and the source region, wherein the first and second heavily doped regions of the first and second conductivity types, respectively, are stacked vertically from bottom to top and have a doping concentration which is larger than that of the well region. A gate structure is disposed on the semiconductor substrate.

An exemplary embodiment of a method for fabricating a semiconductor device comprises providing a semiconductor substrate of a first conductivity type. A well region of a second conductivity type is formed in the semiconductor substrate. At least one set of the first and second heavily doped regions is formed in the well region, wherein the first and second heavily doped regions of the first and second conductivity types, respectively, are stacked vertically from bottom to top and have a doping concentration which is larger than that of the well region. A drain region and a source region are respectively formed in the semiconductor substrate inside and outside of the well region, such that the set of first and second heavily doped regions is in the well region between the drain region and the source region. A gate structure is formed on the semiconductor substrate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of a mode for carrying out the invention. This description is made for the purpose of illustrating the general principles of the invention and should not be taken in a limiting sense. The scope of the invention is best determined by reference to the appended claims.

Figure 1:
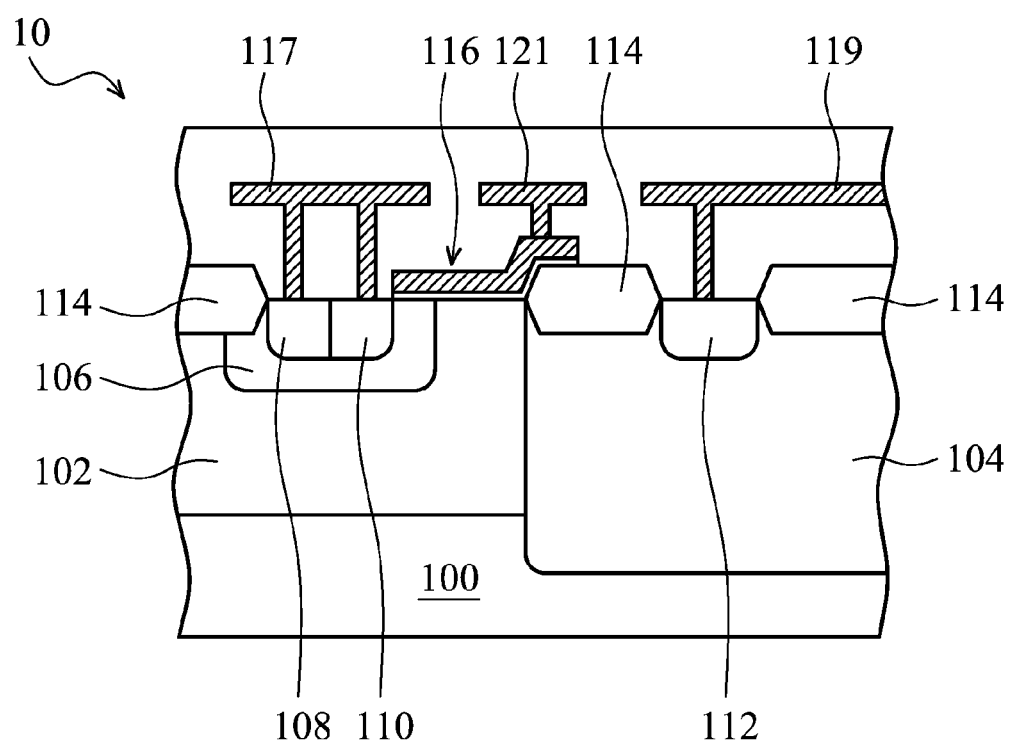
FIG. 1 is a cross section of a conventional n-type LDMOSFET.
Figure 2A:
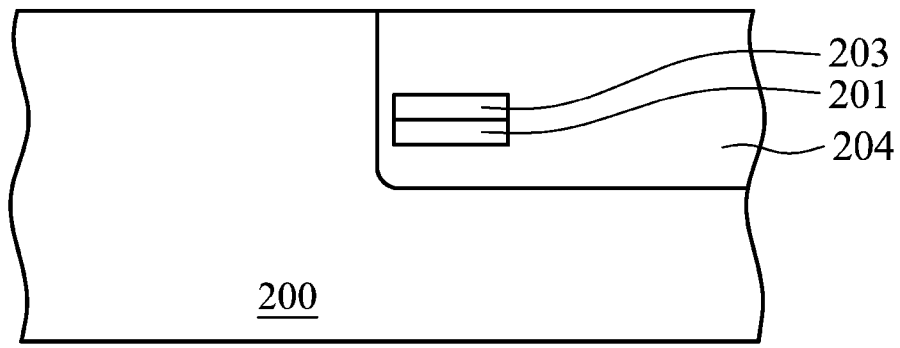
FIGS. 2A to 2D are cross sections of an exemplary embodiment of a method for fabricating a semiconductor device according to the invention.
Figure 2B:
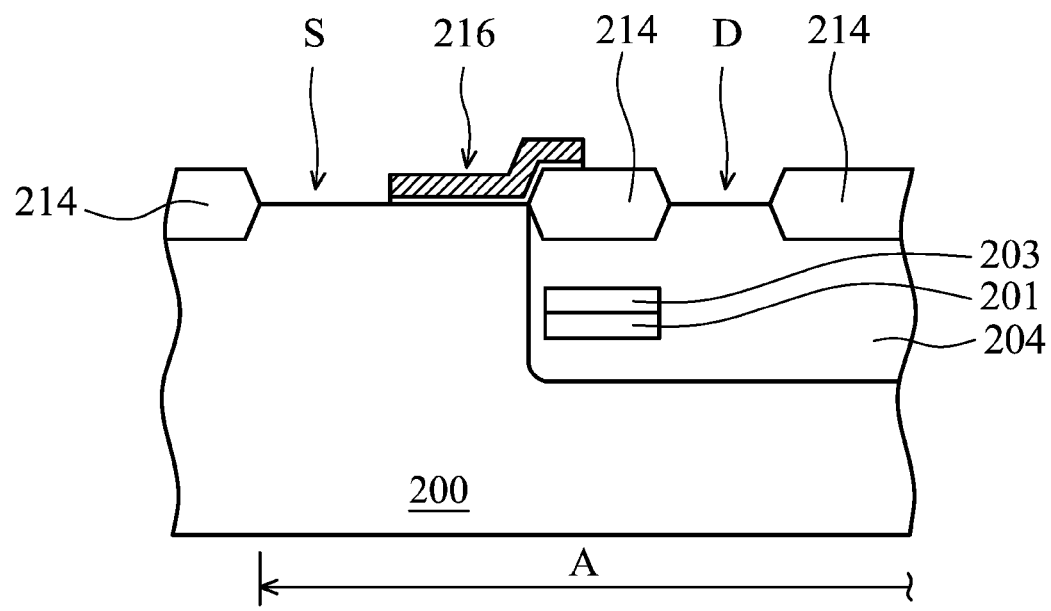
Figure 2C:
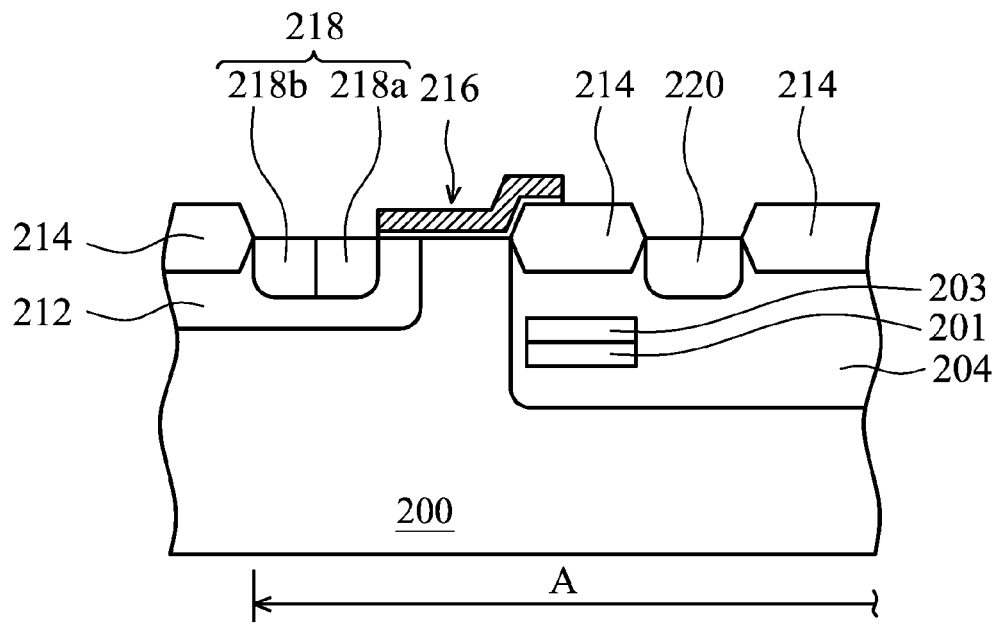
Figure 2D:
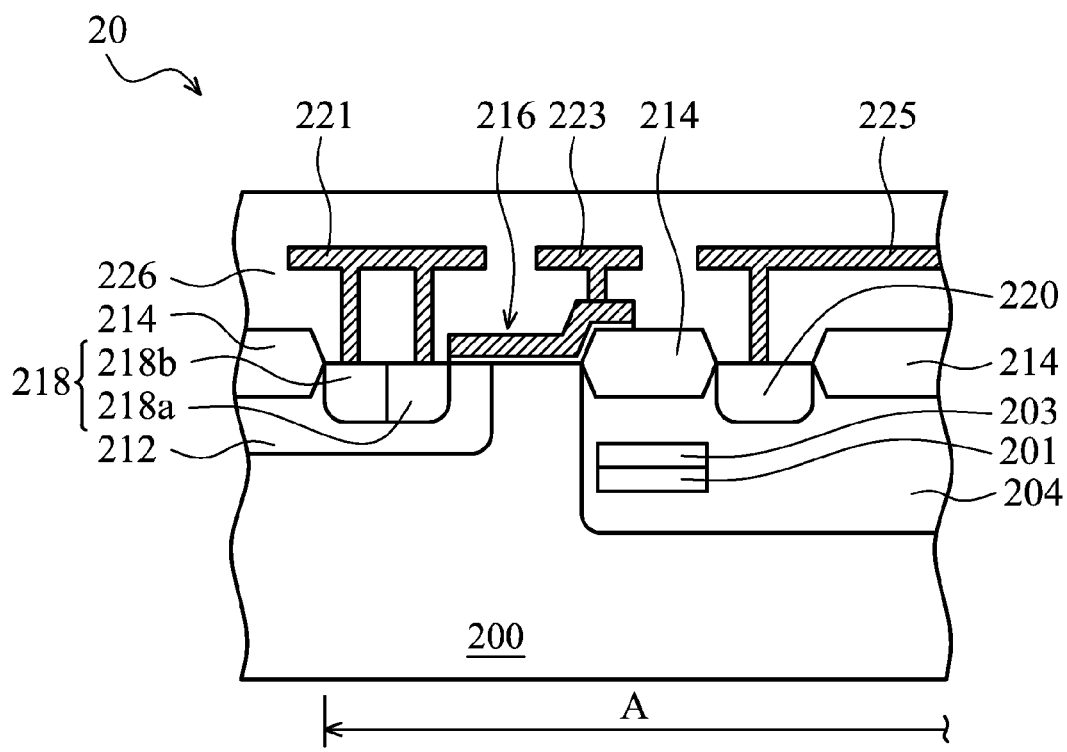

FIG. 2D illustrates a cross section of an exemplary embodiment of a semiconductor device 20 according to the invention. In the embodiment, the semiconductor device 20 may be a laterally diffused metal-oxide-semiconductor field effect transistor (LDMOSFET) having super junction structures. Moreover, the semiconductor device 20 comprises a semiconductor substrate 200, such as, a silicon substrate, silicon on insulator (SOI) substrate or other suitable semiconductor substrate, of a first conductivity type.

A well region 204, a source region 218, a drain region 220 and a body region 212 are formed in the semiconductor substrate 200. For example, the well region 204 of a second conductivity type opposite to the first conductivity type extends into the semiconductor substrate 200 from the top surface of the semiconductor substrate 200. Moreover, the well region 204 corresponds to an active region A (which is defined by a portion of the isolation structure, such as the field oxide layer 214) of the semiconductor substrate 200 to serve as a drift region of the LDMOSFET.

The source region 218 comprises a doped region 218a of the second conductivity type and a doped region 218b of the first conductivity type. The source region 218 is formed in the semiconductor substrate 200 outside of the well region 204 and corresponds to the active region A. Moreover, the body region 212 of the first conductivity type is formed in the semiconductor substrate 200 outside of the well region 204, such that the source region 218 is in the body region 212. The drain region 220 is formed of the doped region of the second conductivity type only. The drain region 220 is formed in the well region 204 and corresponds to the active region A.

At least one set of the first heavily doped region 201 and second heavily doped region 203 is formed in the well region 204 between the drain region 220 and the source region 218, wherein the first heavily doped region 201 and the second heavily doped region 203 are stacked vertically from bottom to top and the first heavily doped region 201 is electrically floating. The first and second heavily doped regions 201 and 203 are respectively of the first and second conductivity types and have a doping concentration which is larger than that of the well region 204 to form a super junction structure in the well region 204 of the semiconductor substrate 200. In the embodiment, the first conductivity type is p-type and the second conductivity type is n-type. Alternatively, the first conductivity type is n-type and the second conductivity type is p-type.

In other embodiments, the semiconductor device 20 may comprise a plurality of sets of the first and second heavily doped regions 201 and 203 that is stacked vertically in the well region 204 of the semiconductor substrate 200 to form a plurality of the super junction structures in the semiconductor substrate 200.

A gate structure 216 is disposed on the semiconductor substrate 200 and between the source region 218 and the drain region 220. The gate structure 216 typically comprises a gate (e.g., a polysilicon gate), a gate dielectric layer underlying the gate and a field oxide layer 214 underlying the gate dielectric layer.

The semiconductor device 20 further comprises an interlayer dielectric (ILD) layer 226 and a plurality of interconnect structures 221,223 and 225 therein. In the embodiment, the interconnect structure 221 is electrically connected to the source region 218 to serve as a source electrode, the interconnect structure 223 is electrically connected to the gate structure 216 to serve as a gate electrode and the interconnect structure 225 is electrically connected to the drain region 220 to serve as a drain electrode.

In the foregoing embodiment, the heavily doped region of the first conductivity type and electrically floating in the super junction structure may help in the formation of a depletion region in the well region 204 (i.e., the drift region), thereby improving the withstand voltage of the LDMOSFET in the semiconductor device 20. Moreover, the heavily doped region of the second conductivity type in the super junction structure may provide an additional current path in the well region 204 (i.e., the drift region) to reduce the on-resistance between the source region and the drain region.

FIGS. 2A to 2D are cross sections of an exemplary embodiment of a method for fabricating a semiconductor device 20 according to the invention. Referring to FIG. 2A, a semiconductor substrate 200, such as a silicon substrate, a silicon on insulator (SOI) substrate or other suitable semiconductor substrates, of a first conductivity type is provided. Next, a well region 204 is formed in a predetermined region (i.e., an active region A) of the semiconductor substrate 200 sequentially by a doping process (e.g., ion implantation), and a thermal diffusion process, wherein the well region 204 of a second conductivity type different from the first conductivity type is configured to serve as a drift region of a subsequently formed LDMOSFET.

In the embodiment, one set of the first and second heavily doped regions 201 and 203 may be formed in the well region 204, wherein the first and second heavily doped regions 201 and 203 are stacked vertically from bottom to top. The first and second heavily doped regions 201 and 203 are respectively of the first and second conductivity types and have a doping concentration which is larger than that of the well region 204 to form a super junction structure in the well region 204 corresponding to the semiconductor substrate 200.

In other embodiments, a plurality of sets of the first and second heavily doped regions 201 and 203 are formed in the well region 204 of the semiconductor substrate 200. The plurality of sets of the first and second heavily doped regions 201 and 203 substantially and vertically align to each other to form a plurality of super junction structures in the well region 204 of the semiconductor substrate 200.

In the foregoing embodiment, the first and second heavily doped regions 201 and 203 are between a drain region 220 and a source region 218 (as shown in FIG. 2C) that are subsequently formed, wherein the first heavily doped region 201 is electrically floating. In the embodiment, the first conductivity type is p-type and the second conductivity type is n-type. Alternatively, the first conductivity type is n-type and the second conductivity type is p-type.

Referring to FIGS. 2B and 2C, a plurality of isolation structures, such as a field oxide layer 214, may be formed on the semiconductor substrate 200 by the conventional MOS process, wherein the active region A is defined by a portion of the field oxide layer 214 and a drain region D to be formed in the well region 204 is defined by the rest of the field oxide layer 214. Afterwards, a gate structure 216 is formed on the semiconductor substrate 200 to define a source region S to be formed in the active region A outside of the well region 204, as shown in FIG. 2B.

Next, a body region 212 of the first conductivity type is optionally formed in the semiconductor substrate 200 outside of the well region 204 sequentially by a doping process (e.g., ion implantation), and a thermal diffusion process, such that the subsequently formed source region 218 is in the body region 212. A doped region 218a of the second conductivity type is then formed in the source region S to be formed (as shown in FIG. 2B) and another doped region (i.e., the drain region 220) of the second conductivity type is formed in the drain region D to be formed (as shown in FIG. 2B) by a doping process (e.g., ion implantation). Afterwards, a doped region 218b of the first conductivity type is formed in the source region S to be formed (as shown in FIG. 2B) and adjacent to the doped region 218a, such that the doped region 218b and the doped region 218a form a source region 218, as shown in FIG. 2C.

In other embodiments, the doped region 218b may be formed before forming the doped region 218a and the drain region 220. In the embodiment, the doped region 218, the gate structure 216, the drain region 220 and the well region 204 having the super junction structures form an LDMOSFET.

Referring to FIG. 2D, an interlayer dielectric layer 226 and a plurality of interconnect structures 221, 223 and 225 therein are formed on the semiconductor substrate 200 by the conventional metallization process. The interconnect structure 221 is electrically connected to the source region 218 to serve as a source electrode, the interconnect structure 223 is electrically connected to the gate structure 216 to serve as a gate electrode and the interconnect structure 225 is electrically connected to the drain region 220 to serve as a drain electrode. As a result, the fabrication of the semiconductor device 20 is completed.

According to the foregoing embodiments, the heavily doped region of the first conductivity type and electrically floating in the super junction structure may form a depletion region in the drift region, so that the withstand voltage of the LDMOSFET in the semiconductor device is improved. Moreover, the heavily doped region of the second conductivity type in the super junction structure may provide an additional current path in the drift region, so that the on-resistance of the LDMOSFET is reduced. Additionally, according to the foregoing embodiments, the number of super junction structures stacked vertically in the drift region may be controlled to further improve the withstand voltage of the LDMOSFET while preventing the on-resistance of the LDMOSFET from increasing.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a semiconductor substrate of a first conductivity type;
    a well region of a second conductivity type formed in the semiconductor substrate;
    a drain region and a source region respectively formed in the semiconductor substrate inside and outside of the well region;
    at least one set of first and second heavily doped regions of the first and second conductivity types, respectively, formed in the well region between the drain region and the source region, wherein the first and second heavily doped regions of the first and second conductivity types, respectively, are stacked vertically from bottom to top and have a doping concentration which is larger than that of the well region; and
    a gate structure disposed on the semiconductor substrate.

2. The semiconductor device of claim 1, wherein the first heavily doped region is electrically floating.

3. The semiconductor device of claim 1, further comprising a plurality of sets of first and second heavily doped regions stacked vertically in the well region.

4. The semiconductor device of claim 1, wherein the first conductivity type is p-type and the second conductivity type is n-type.

5. The semiconductor device of claim 1, wherein the first conductivity type is n-type and the second conductivity type is p-type.

6. The semiconductor device of claim 1, further comprising a body region of the first conductivity type formed in the semiconductor substrate outside of the well region, such that the source region is in the body region.

7. A method for fabricating a semiconductor device, comprising:
    providing a semiconductor substrate of a first conductivity type;
    forming a well region of a second conductivity type in the semiconductor substrate;
    forming at least one set of first and second heavily doped regions of the first and second conductivity types, respectively, in the well region, wherein the first and second heavily doped regions of the first and second conductivity types, respectively, are stacked vertically from bottom to top and have a doping concentration which is larger than that of the well region;
    forming a drain region and a source region respectively in the semiconductor substrate inside and outside of the well region, such that the set of first and second heavily doped regions is in the well region between the drain region and the source region; and
    forming a gate structure on the semiconductor substrate.

8. The method of claim 7, wherein the first heavily doped region is electrically floating.

9. The method of claim 7, further comprising forming a plurality of sets of first and second heavily doped regions in the well region, wherein the plurality of sets of first and second heavily doped regions are stacked vertically.

10. The method of claim 7, wherein the first conductivity type is p-type and the second conductivity type is n-type.

11. The method of claim 7, wherein the first conductivity type is n-type and the second conductivity type is p-type.

12. The method of claim 7, further comprising forming a body region of the first conductivity type in the semiconductor substrate outside of the well region, such that the source region is in the body region.

* * * * *